(12) United States Patent
Cheng

(10) Patent No.: US 7,433,229 B2
(45) Date of Patent: Oct. 7, 2008

(54) FLASH MEMORY DEVICE WITH SHUNT

(75) Inventor: Kuo-Yi Cheng, Hsinchu Hsien (TW)

(73) Assignee: Phison Electronics Corp., Miaoli (TW)

( * ) Notice: Subject to any disclaimer, the term of this patent is extended or adjusted under 35 U.S.C. 154(b) by 134 days.

(21) Appl. No.: 11/613,175

(22) Filed: Dec. 19, 2006

(65) Prior Publication Data
US 2008/0144375 A1     Jun. 19, 2008

(51) Int. Cl.
*G11C 16/04* (2006.01)
(52) U.S. Cl. .............................. 365/185.05; 365/185.01; 365/185.17; 365/52; 438/15; 361/679; 361/715; 361/720; 361/8; 361/13; 257/137
(58) Field of Classification Search ............ 365/185.01, 365/185.05, 185.17, 52; 438/15; 361/679, 361/715, 720, 8, 13; 257/137
See application file for complete search history.

(56) References Cited

U.S. PATENT DOCUMENTS

| 5,774,395 A * | 6/1998 | Richart et al. ............ 365/185.3 |
| 2003/0107908 A1* | 6/2003 | Jang et al. ..................... 365/51 |
| 2005/0110511 A1* | 5/2005 | Gabara et al. ................ 324/763 |

* cited by examiner

*Primary Examiner*—Richard Elms
*Assistant Examiner*—Eric Wendler
(74) *Attorney, Agent, or Firm*—Jianq Chyun IP Office

(57) ABSTRACT

A shunt activation signal is transmitted by an external control terminal through an external transmission interface to switch a flash memory controller in a shunt mode. The shunt activation signal of the external transmission interface can set up a switch as shunt. When the flash memory controller is defective due to errors or damage, the shunt mode enables the external control terminal to directly process data saving/retrieving to the flash memory chip or testing through the external transmission interface. Thus, the user need not purchase a new flash memory to replace the defective flash memory with the damaged flash memory controller.

15 Claims, 2 Drawing Sheets

FLASH MEMORY DEVICE WITH SHUNT

BACKGROUND OF THE INVENTION

1. Field of the Invention

The present invention is related to a flash memory device with shunt, and more particularly to a flash memory device with shunt comprising a switch set up as short through a shunt activation signal of an external transmission interface such that when the flash memory controller incur errors or damages, the shunt enables access directly from the external control terminal to the flash memory chip through the external transmission interface for processing saving/retrieving data or testing.

2. Description of Related Art

Nowadays, the technology of the flash memory is being rapidly developed, and the manufacturers have progressively created the flash memory with larger capacity, for example, MP3 player, personal digital assistant (PDA), digital camera, digital video camera or other multimedia device. The communication device such as cellular phone has a memory card. The flash memory has different specifications or requests for its application, and different types, sizes and specifications of the memory cards are needed. The available memory cards are mostly MMC (multimedia card), CF (compact flash card), SMC (smart media card), MS (memory stick) and SD (secure digital memory card). The convenience of using the flash memory has made the flash memory an indispensable device.

The types of the flash memories are classified according to their technical structure such as NOR type, NAND type, DINOR type and AND type. The NOR type flash memory has the program code as the main storage and is known as NOR; the NAND type flash memory has the information as the main storage and is known as NAND.

The NAND type flash memory has become the mainstream storage media due to its large capacity and fast processing speed. However, the process of saving and retrieving information and management thereof are very complicated. Therefore, the NAND flash controller is available for simplifying the use of the NAND type flash memory. The NAND flash controller and the NAND type flash memory can be packaged into a single chip to form a multi chip package (MCP). Even though the flash memory interface of the single chip is as the same as the other NAND type flash memory, but the operation procedure thereof is the same as of the conventional ATA device where only the logic address of the flash memory is defined and required no complicated management of the flash memory. But the chip produced in the MCP has problems of testing during the mass production. Because the NAND type flash memory is not directly connected to the lead of the chip, therefore the chip cannot be externally directly be tested or measured.

Furthermore, the conventional MCP may differentiate a packaged chip from the defective chip and when the connection interface between the chips is damaged or defective, the cause of defect carried by the packaged flash memory cannot be located easily in the conventional MCP. Therefore, how to overcome the defect of the conventional design is an important issue for the manufacturer in the field.

SUMMARY OF THE INVENTION

According to an aspect of the present invention, a switch in the flash memory controller is respectively connected between the first bonding pad and the first pad, and the second pad and the second bonding pad, to form a shunt. Thus, the test method may be implemented by using a general testing method.

According to another aspect of the present invention, a shunt activation signal of an external transmission interface can set up the switch as a short. When the flash memory controller is defective due to errors or damage, the shunt-circuit mode enables the external control terminal to directly process data saving/retrieving or testing to the flash memory chip through the external transmission interface. Thus, the user need not purchase a new flash memory to replace the defective flash memory with the damaged flash memory controller.

DETAIL DESCRIPTION OF THE INVENTION

Figure 1:
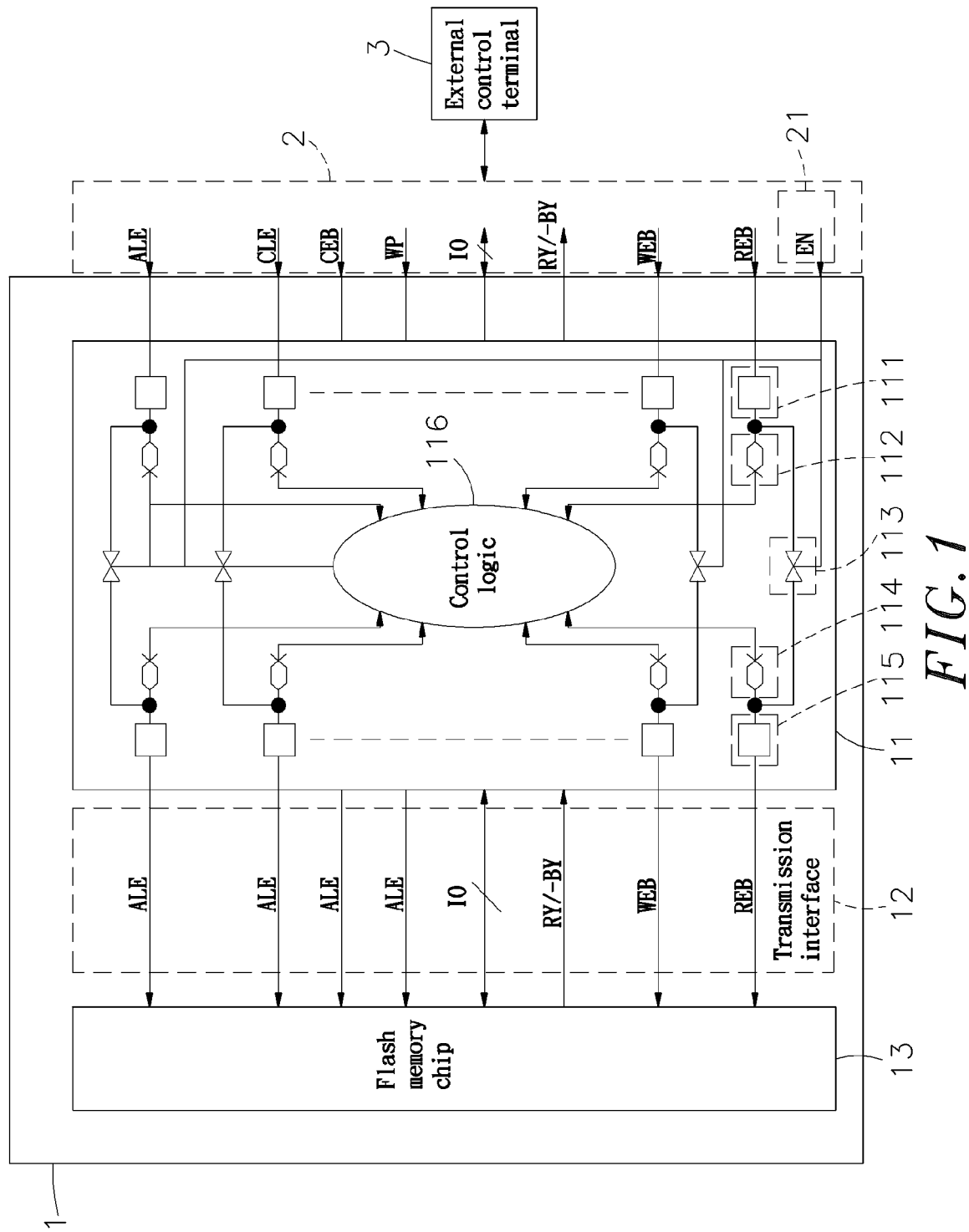
FIG. 1 is a perspective view of a system according to an embodiment of the present invention.
Figure 2:
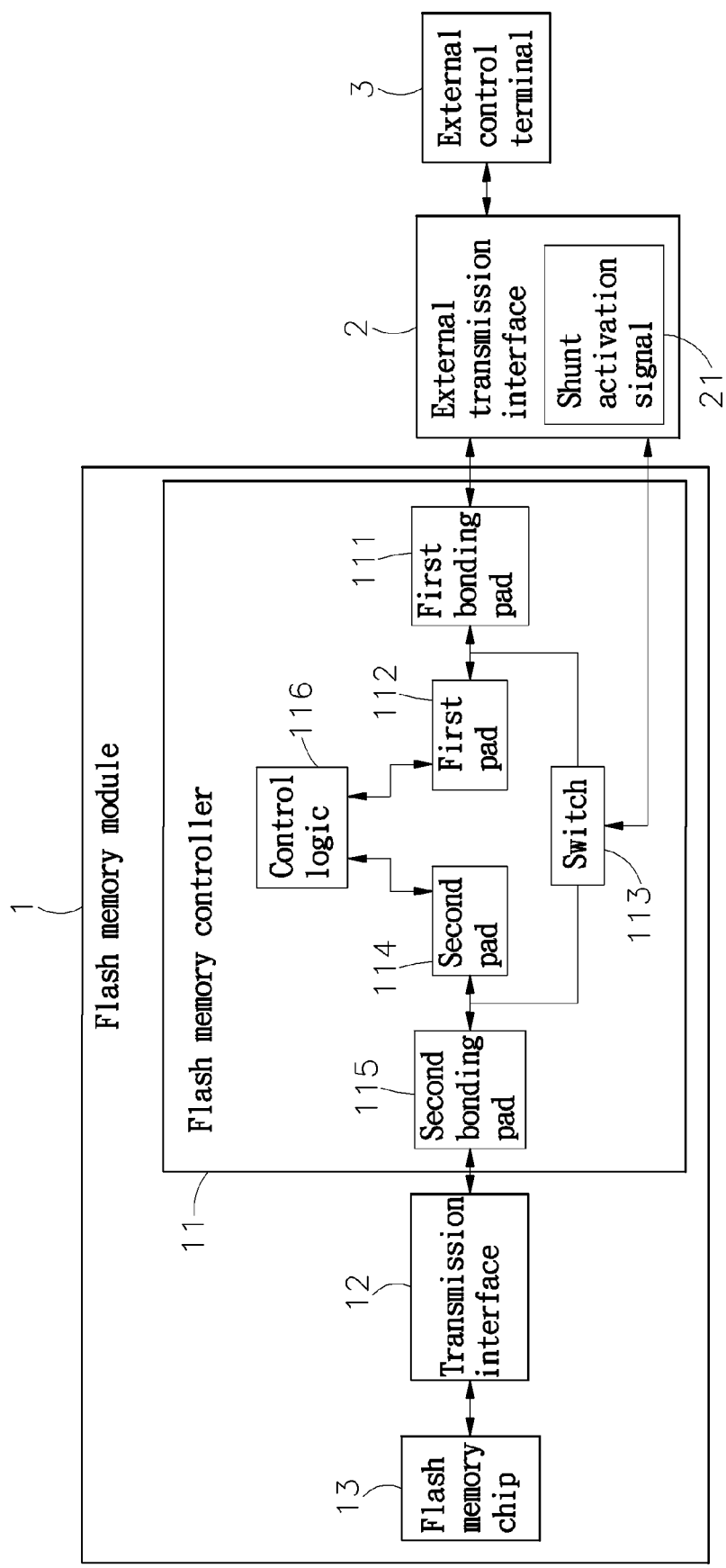
FIG. 2 is a block diagram of a system according to an embodiment of the present invention.

Referring to FIGS. 1 and 2, the present invention is shown comprised of a flash memory module 1, an external transmission interface 2 and an external control terminal 3. The flash memory module 1 comprises a flash memory controller 11, a transmission interface 12 and a flash memory chip 13.

The flash memory controller 11 comprises one or a plurality of first bonding pads 111, a first pad 112, a switch 113, a second pad 114, a second bonding pad 115 and a control logic 116.

The transmission interface 12 is used to connect a chip in the flash memory module 1. The transmission interface 12, according to an embodiment of the present invention, is connected to the flash memory controller 11 and the flash memory chip 13 respectively.

The flash memory chip 13 is a rewritable integrated circuit for storing application programs, digital data or multimedia.

Referring to FIGS. 2 and 1 again, when the flash memory module 1 is in the general mode or the test mode, the switch 113 of the flash memory controller 11 is in the open mode. When the external control terminal 3 transmits a saving/retrieving signal or testing signal to the flash memory module 1 through the external transmission interface 2, the saving/retrieving signal or testing signal is transmitted in an orderly manner from the external transmission interface 2 to the first bonding pad 111, the first pad 112 and the control logic 116 for processing calculation. The control logic 116 is used to control the calculation control logic of the flash memory module 1. When the calculation is completed, the calculated signal is transmitted in an orderly manner from the control logic 116, the second pad 114, the second bonding pad 115 and the transmission interface 12 to the flash memory chip 13 for processing saving/retrieving. On the other hand, the process of saving/retrieving data to the flash memory chip 13 or a test result is in a reversed sequence of the above process steps, that is, the data in the flash memory chip 13 or the test result is transmitted in an orderly manner from the transmission interface 12, the second bonding pad 115 and the second pad 114 to the control logic 116, and after calculation by the control logic 116, the data or the test result is transmitted in an orderly manner from the first pad 112 and the first bonding pad 111 to the external control terminal 3 through the external transmission interface 2. The flash memory chip 13 may be comprised of a NAND type flash memory. The flash memory chip 13 may comprise a plurality of chip.

Still referring to FIGS. 1 and 2, when the flash memory module 1 is in the shunt mode or the shunt test mode, the switch 113 of the flash memory controller 11 is in short mode. First of all, the external control terminal 3 transmits a shunt activation signal 21 through the external transmission interface 2 for switching the switch 113 in the short-circuit mode. When the switch 113 is in short-circuit mode, the control logic 116 switches the first pad 112 and the second pad 114 into the input mode. Thus, a test signal or a saving/retrieving signal is transmitted from the first bonding pad 111 to the switch 113 and the second bonding pad 115 in an orderly manner. Finally, the test signal or the saving/retrieving signal is transmitted to the flash memory chip 13 through the transmission interface 12 for processing data saving/retrieving or testing. On the other hand, the process for saving/retrieving data to the flash memory chip 13 or a test result is in a reversed sequence of the above process steps described above, i.e. the data in the flash memory chip 13 or the test result is transmitted in an orderly manner from the second bonding pad 115 to the switch 113 and the first pad 111. Finally, the data or the test result is transmitted to the external control terminal 3 through the external transmission interface 2. Because to the switch 113 is in the short-circuit mode, the test signal or the saving/retrieving signal need not be transmitted through the first pad 112, the second pad 114 and the control logic 116 of the flash memory controller 11. Accordingly, the external control terminal 3 can directly process data saving/retrieving or testing to the flash memory chip 13 of the flash memory module 1.

The flash memory module 1 may be packaged in a multi-chip package (MCP), a ball grid array (BGA) package, a UFBGA package or the like. However, the present invention is not limited to the aforementioned packages; any equivalent structure shall also be construed with the scope of the present invention.

Accordingly, the present invention has at least the following advantages.

1. The flash memory controller 11 of the present invention comprises a switch 113 connected between the first bonding pad 111 and the first pad 112, and the second pad 114 and the second bonding pad 115 to form a shunt structure in the flash memory controller 11 so that the flash memory controller 11 and the flash memory chip 13 can be tested by a general testing method. Accordingly, any research for MCP is not required. Thus, mass production of the flash memory controller 11 and the flash memory chip 13 can be effectively promoted.

2. The shunt activation signal 21 of the external transmission interface 2 may set up the switch 113 in the short-circuit mode. Thus, when the flash memory controller 11 of the flash memory in the present invention is defective due to error or damage, the shunt mode enables the external control terminal 3 to directly process saving/retrieving data or testing to the flash memory chip 13 through the external transmission interface 2. Therefore, when the flash memory controller 11 is damaged, the user need not purchase another flash memory for replacement and the flash memory still can be used by merely activating the shunt mode.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What the invention claimed is:

1. A flash memory device with shunt comprising a flash memory module, an external transmission interface and an external control terminal, said flash memory module having:
    a flash memory controller, comprising a control logic, at least one first pad and at least one second pad respectively connected to said control logic, at least one first bonding pad connected to said at least one first pads, at least one second bonding pad connected to said at least one second pad, and a switch connected between said at least one first bonding pad and said at least one first pad, and between said at least one second bonding pad and said at least one second pad;
    a flash memory chip, being a rewritable integrated circuit for storing; and
    a transmission interface, connected to said flash memory controller and said flash memory chip; wherein a shunt activation signal is transmitted by said external control terminal through said external transmission interface to switch said flash memory module in a shunt mode, and said external control terminal commands a testing signal or a saving/retrieving data signal to said flash memory chip.

2. The flash memory device with shunt according to claim 1, wherein said switch switches to a short-circuit mode or an open mode according to said shunt activation signal.

3. The flash memory device with shunt according to claim 1, wherein said switch is connected between said at least one first bonding pad and said at least one first pad for transmitting said testing signal or said saving/retrieving data signal to said flash memory chip through said at least one second bonding pad.

4. The flash memory device with shunt according to claim 1, wherein said switch is connected between said at least one second bonding pad and said at least one second pad for transmitting said testing signal or said saving/retrieving data signal to said external controller terminal through said at least one first bonding pad.

5. The flash memory device with shunt according to claim 1, wherein said flash memory chip comprises a NAND type flash memory.

6. The flash memory device with shunt according to claim 1, wherein said flash memory chip comprises a plurality of chips.

7. The flash memory device with shunt according to claim 1, wherein said flash memory module comprises a MCP, a BGA package and a UFBGA package.

8. A flash memory device with shunt comprising a flash memory module, an external transmission interface and an external control terminal, said flash memory module having:
    a flash memory chip, being a rewritable integrated circuit for storing;
    a flash memory controller, comprising a control logic, a plurality of bonding pads, a plurality of pads and a switch connected between said plurality of bonding pads and said plurality of pads for switching a testing signal or a saving/retrieving data signal; and
    a transmission interface, connected to said flash memory controller and said flash memory chip respectively, wherein a shunt activation signal is transmitted by said external control terminal through said external transmission interface to switch said flash memory module in a shunt mode.

9. The flash memory device with shunt according to claim 8, wherein said switch switches to a short-circuit mode or an open mode according to said shunt activation signal.

10. The flash memory device with shunt according to claim 8, wherein said flash memory chip comprises a NAND type flash memory.

11. The flash memory device with shunt t according to claim 8, wherein said flash memory chip comprises a plurality of chips.

12. The flash memory device with shunt according to claim 8, wherein said flash memory module comprises a MCP, a BGA package and a UFBGA package.

13. A switching method for a flash memory device with shunt, comprising the step of:
(a) transmitting a shunt activation signal from an external control terminal through an external transmission interface to switch a flash memory module in a shunt mode;
(b) commanding a testing signal or a saving/retrieving data signal from said external control terminal to a flash memory chip; and
(c) switching said flash memory module to a short-circuit mode or an open mode by a switch according to said shunt activation signal.

14. The switching method for the flash memory device with shunt according to claim 13, wherein said flash memory chip comprises a NAND type flash memory.

15. The switching method for a flash memory device with shunt according to claim 13, wherein said flash memory chip comprises a plurality of chips.

* * * * *